United States Patent
Lavi

(10) Patent No.: US 6,396,896 B1
(45) Date of Patent: May 28, 2002

(54) IMPLEMENTATION OF FUNCTIONS OF MULTIPLE SUCCESSIVE BITS OF A SHIFT REGISTER

(75) Inventor: Yoav Lavi, Raanana (IL)

(73) Assignee: 3G.com Inc., Lexington, MA (US)

( * ) Notice: Subject to any disclaimer, the term of this patent is extended or adjusted under 35 U.S.C. 154(b) by 0 days.

(21) Appl. No.: 09/561,040

(22) Filed: Apr. 28, 2000

(51) Int. Cl.[7] ................................................ G11C 19/00
(52) U.S. Cl. ........................................... 377/73; 377/81
(58) Field of Search ...................................... 377/73, 81

(56) References Cited

U.S. PATENT DOCUMENTS

| | | |
|---|---|---|
| 4,749,886 A | 6/1988 | Hedayati |
| 5,039,883 A | 8/1991 | On |
| 5,631,913 A | 5/1997 | Maeda |
| 5,638,309 A | 6/1997 | Negi |
| 5,790,626 A * | 8/1998 | Johnson et al. ................ 377/69 |
| 5,811,985 A | 9/1998 | Trimberger et al. |
| 5,818,270 A | 10/1998 | Hamza |
| 5,861,762 A | 1/1999 | Sutherland |
| 5,896,406 A | 4/1999 | Berry et al. |
| 5,938,784 A | 8/1999 | Kim |
| 5,946,473 A | 8/1999 | Lotspiech et al. |
| 5,966,029 A | 10/1999 | Tarrab et al. |

* cited by examiner

Primary Examiner—Margaret R. Wambach
(74) Attorney, Agent, or Firm—E. Eric Hoffman; Law Offices of Bever, Hoffman & Harms, LLP

(57) ABSTRACT

A circuit for providing a function of a plurality of consecutive bits in a shift register is provided. The circuit includes a 2-input logic gate having a first input terminal connected to receive a bit being shifted into the shift register, and a second input terminal coupled to receive a bit being shifted out of the shift register. The circuit further includes a sequential logic device having an input terminal coupled to an output terminal of the 2-input logic gate, an output terminal that provides the function, and a control terminal coupled to receive a control signal for resetting the sequential logic device. In one embodiment, the 2-input logic gate is an exclusive OR gate, and the sequential logic device is a toggle flip-flop. In this embodiment, the function is a logical exclusive OR of the consecutive bits in the shift register. The function is implemented by initializing an output signal of the sequential logic device when the consecutive bits of the shift register have a predetermined value. Then, the bit to be shifted into the shift register is compared with the bit to be shifted out of the shift register. The output signal of the sequential logic device is toggled if no match is detected, and maintained if a match is detected. In other embodiments, functions other than an exclusive OR function can be implemented.

36 Claims, 6 Drawing Sheets

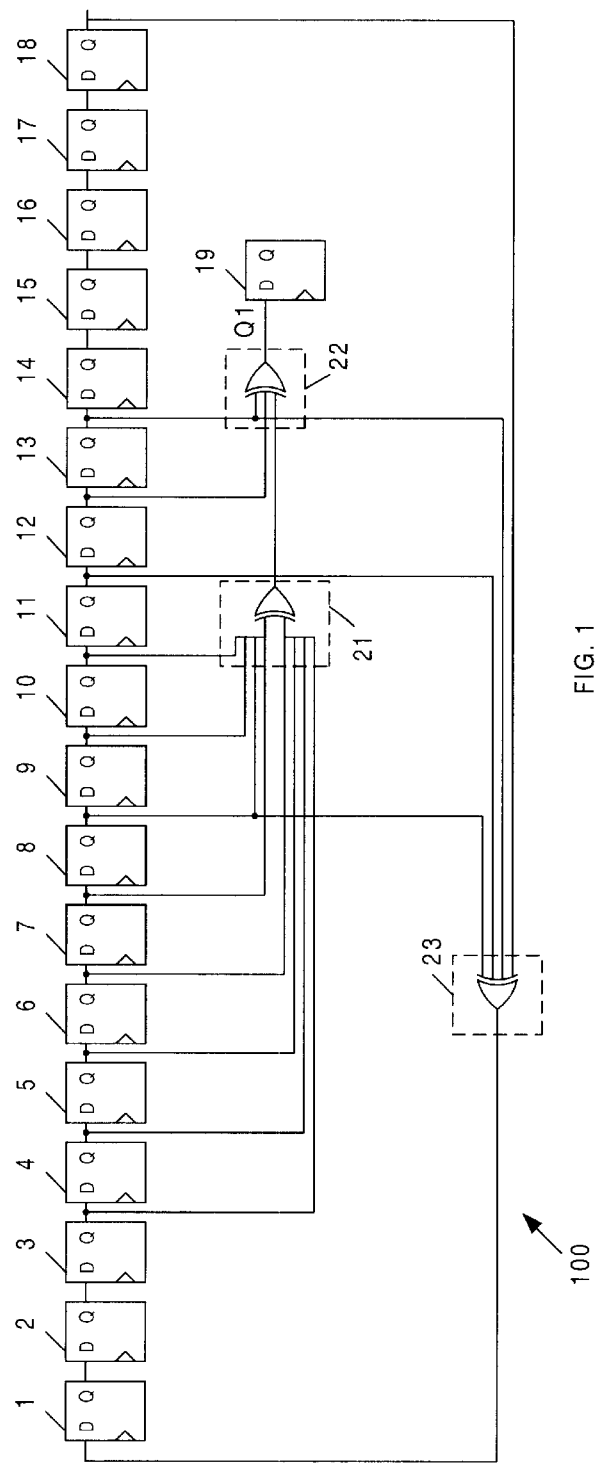
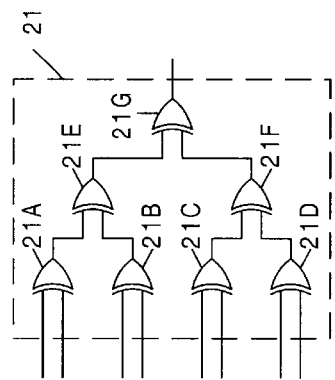
FIG. 1 (PRIOR ART)
FIG. 2 (PRIOR ART)

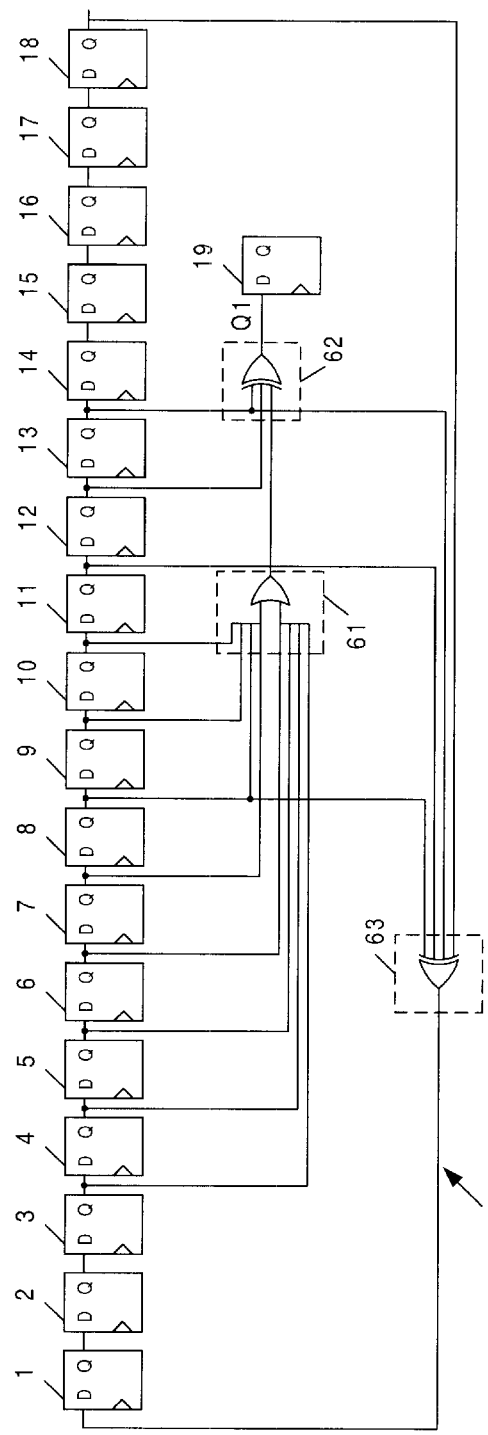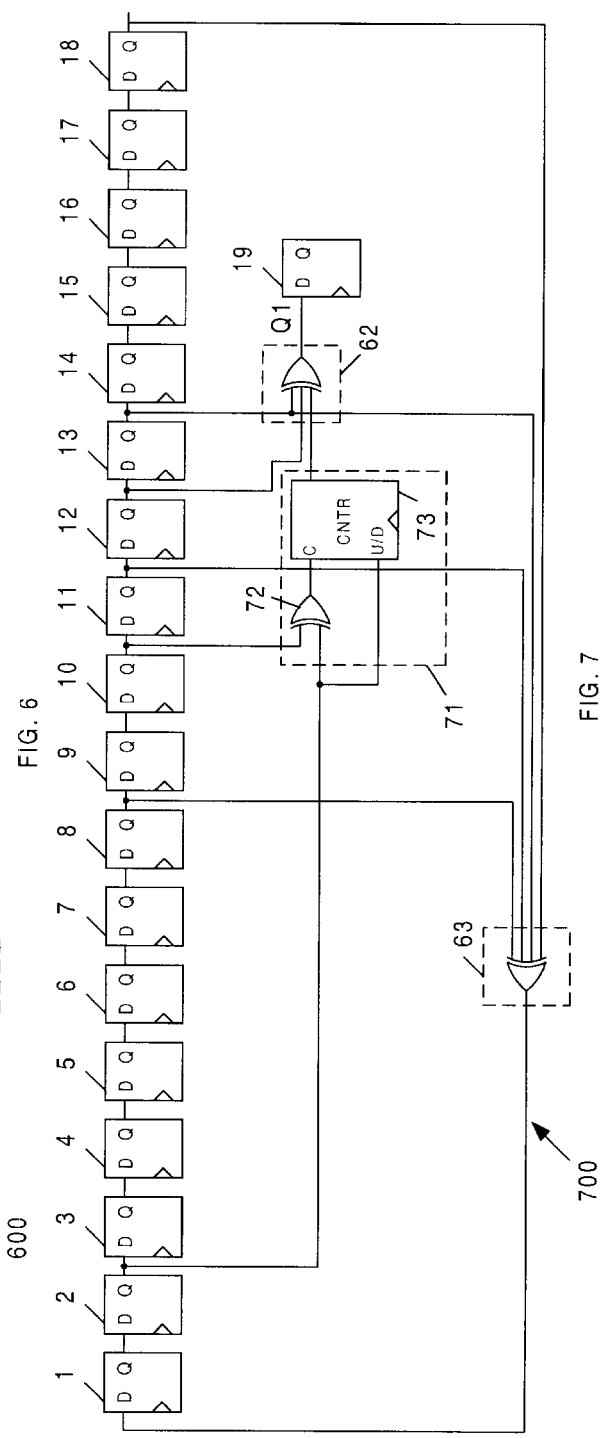

IMPLEMENTATION OF FUNCTIONS OF MULTIPLE SUCCESSIVE BITS OF A SHIFT REGISTER

FIELD OF THE INVENTION

The present invention relates to feedback shift registers. More specifically, the present invention relates to an exclusive OR (XOR) logic function of consecutive bits of a feedback shift register.

RELATED ART

Long shift registers in general, and feedback shift registers in particular, are well established in the areas of digital electronics, and are used for numerous purposes. In particular, feedback shift registers (FSR) are used for the generation of pseudo-random series, in applications such as digital communication.

FIG. 1 is a circuit diagram of a conventional feedback shift register 100. Feedback shift register 100 implements a proposed scrambling function for the downlink of a 3$^{rd}$ generation telephony system. (See, 3GPP publication TS 25.213 V2.1.2, FIG. 14.)

Feedback shift register 100 includes a plurality of DQ flip-flops 1–18, which are connected in a chain, such that the Q output terminals of flip-flops 1–17 are connected to the D input terminals of flip-flops 2–18, respectively. Each of flip-flops 1–18 is clocked by a predetermined edge (e.g., the rising edges) of the same clock signal. As a result, binary data is shifted through the chain of flip-flops 1–18 in response to the clock signal.

The first flip-flop in the chain (i.e., flip-flop 1) receives a signal from a feedback function 23. In feedback shift register 100, feedback function 23 is a 4-input exclusive OR function, which has input terminals coupled to the Q output terminals of flip-flops 8, 11, 13 and 18.

Exclusive OR functions 21 and 22 provide a signal Q1 in response to other bits stored by feedback shift register 100. Signal Q1 is latched into DQ flip-flop 19. Exclusive OR function 21 is implemented by an 8-input exclusive OR device coupled to the Q output terminals of consecutive flip-flops 3–10. Exclusive OR function 22 is implemented by a 3-input exclusive OR device coupled to the output terminal of exclusive OR function 21 and to the Q output terminals of flip-flops 12 and 13.

In general, (N–1) 2-input exclusive OR gates are needed to implement an N-input exclusive OR function. Thus, seven 2-input exclusive OR gates are required to implement 8-input exclusive OR function 21. FIG. 2 is a circuit diagram of the seven 2-input exclusive OR gates 21A–21G used to implement 8-input exclusive OR function 21. For a reasonably fast implementation, exclusive OR gates 21A–21G are arranged in a three-level hierarchy, wherein exclusive OR gates 21A–21D are connected to form the first level, exclusive OR gates 21E–21F are connected to form the second level and exclusive OR gate 21G is connected to form the third level.

An exclusive OR gate is a relatively complex logic gate, with a CMOS implementation typically requiring 8 to 10 transistors. In addition, an exclusive OR gate has a significant signal propagation delay, which is roughly equivalent to twice the propagation delay of a simple logic gate. Thus, exclusive OR function 21 requires approximately 70 transistors and exhibits a signal propagation delay roughly equivalent to that of 6 simple logic gates.

It would therefore be desirable to have a structure that replaces a multiple-input exclusive OR function of a plurality of successive shift register bits and significantly reduces both transistor count and signal delay.

SUMMARY

Accordingly, the present invention provides a circuit for implementing a function of a plurality of consecutive bits in a shift register. The circuit includes a 2-input logic gate having a first input terminal connected to receive a bit being shifted into the shift register, and a second input terminal coupled to receive a bit being shifted out of the shift register. The circuit further includes a sequential logic device having an input terminal coupled to an output terminal of the 2-input logic gate, an output terminal that provides the function, and a control terminal coupled to receive a control signal for resetting the sequential logic device.

In one embodiment, the 2-input logic gate is an exclusive OR gate, and the sequential logic device is a toggle flip-flop. In this embodiment, the function is a logical exclusive OR of the consecutive bits in the shift register. The function is implemented by resetting the output signal of the toggle flip-flop when the consecutive bits of the shift register have a predetermined value (e.g., all logic "1" values). Then, the exclusive OR gate compares the bit to be shifted into the shift register with the bit to be shifted out of the shift register. The output signal of the toggle flip-flop is toggled if the exclusive OR gate indicates that no match exists. Conversely, the output signal of the toggle flip-flop remains unchanged if the exclusive OR gate indicates that a match exists.

The circuit constructed using the exclusive OR gate and the toggle flip-flop uses about 30 transistors and exhibits a delay of roughly 4 simple gates. Thus, this circuit has a significantly lower transistor requirement and a shorter signal delay than the prior art.

In other embodiments, functions other than an exclusive OR function of consecutive bits of a shift register can be implemented.

The present invention will be more fully understood in view of the following description and drawings.

BRIEF DESCRIPTION OF THE DRAWINGS

FIG. 1 is a circuit diagram of a conventional feedback shift register.

FIG. 2 is a circuit diagram of a conventional 8-input exclusive OR device.

FIG. 6 is a circuit diagram of a feedback shift register that includes an 8-input OR function.

FIG. 7 is a circuit diagram of a feedback shift register that replaces the 8-input OR function of FIG. 6 with an exclusive OR gate and an up/down counter.

DETAILED DESCRIPTION

Figure 3:
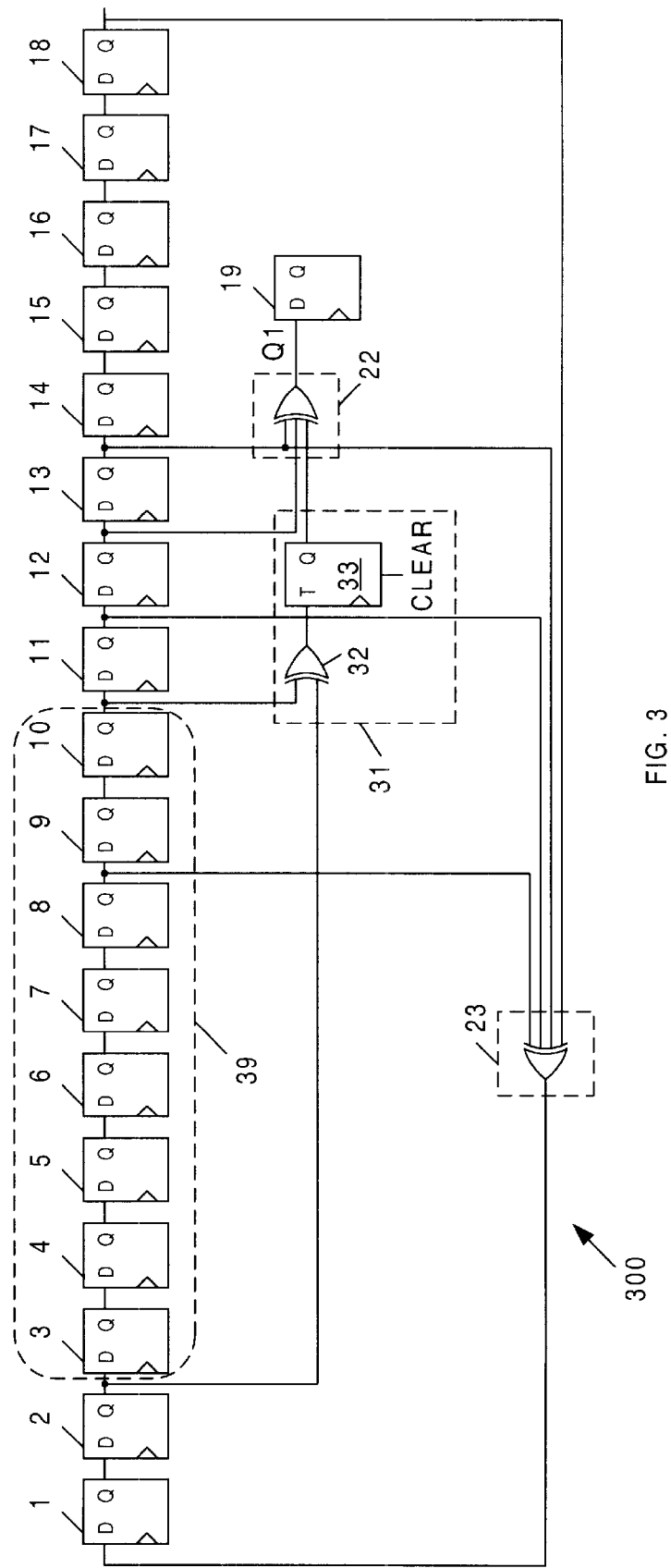
FIG. 3 is a circuit diagram of a feedback shift register in accordance with one embodiment of the present invention.

FIG. 3 is a circuit diagram of a feedback shift register 300 in accordance with one embodiment of the present invention. Because feedback shift register 300 is similar to feedback shift register 100 (FIG. 1), similar elements in FIGS. 1 and 3 are labeled with similar reference numbers. Feedback shift register 300 therefore includes DQ flip-flops 1–19 and exclusive OR functions 22 and 23. In addition, feedback shift register 300 includes function 31, which includes 2-input exclusive OR gate 32 and toggle flip-flop 33. As described in more detail below, function 31 replaces function 21 of feedback shift register 100.

Function 31 includes 2-input exclusive OR gate 32 and toggle (T) flip-flop 33. Function 31 can therefore be constructed using about 30 transistors (ten for exclusive OR gate 32 and twenty for toggle flip-flop 33). Function 31 exhibits a signal delay of roughly 4 simple gates (2 gate delays through exclusive OR gate 32 and 2 gate delays to toggle flip-flop 33). The input terminals of exclusive OR gate 32 are coupled to the Q output terminals of flip-flops 2 and 10. The output terminal of exclusive OR gate 32 is coupled to the T input terminal of toggle flip-flop 32. The Q output terminal of toggle flip-flop 33 is coupled to an input terminal of exclusive OR function 22. Toggle flip-flop 33 includes a CLEAR input terminal, which is coupled to receive a CLEAR control signal. Toggle flip-flop 33 changes states on the rising edge of an applied clock signal if a logic "1" value is being applied to the T input terminal. If a logic "0" value is applied to the T input terminal, then toggle flip-flop 33 does not change states.

Feedback shift register 300 operates as follows. Flip-flops 3–10 are initially loaded with logic "1" values. This can be accomplished by applying a logic high value to the SET input terminals (not shown) of flip-flops 1–18. Alternatively, the input signal applied to the D input terminal of flip-flop 1 can be held at a logic "1" value for 18 clock cycles. To accomplish this, the input signal provided to flip-flop 1 can be the logical OR of the output signal provided by exclusive OR function 23 and an initialization control signal. The initialization control signal is held at a logic "1" value during initialization, and at a logic "0" value during normal operation of feedback shift register 300.

When each of flip-flops 3–10 stores a logic "1" value, the CLEAR control signal is asserted, thereby causing toggle flip-flop 33 to provide a logic "0" output value. The CLEAR control signal is asserted one time only, when it is known that each of flip-flops 3–10 stores a logic "1" value.

After feedback shift register 300 has been initialized as described above, the output signal provided by function 31 will be logically equivalent to the output signal provided by an 8-input exclusive OR device coupled to the Q output terminals of consecutive flip-flops 3–10. That is, the output signal provided by function 31 will be logically equivalent to the output signal provided by function 21 (FIG. 1). Series-connected flip-flops 3–10 are herein referred to as flip-flop chain 39.

Two-input exclusive OR gate 32 is coupled to receive the values provided by flip-flops 2 and 10. Thus, exclusive OR gate 32 is coupled to receive the next value to be shifted into flip-flop chain 39, as well as the next value to be shifted out of flip-flop chain 39. When the value shifted into flip-flop chain 39 is the same as the value shifted out of flip-flop chain 39, then the output value provided by toggle flip-flop 33 is unchanged. However, when the value shifted into flip-flop chain 39 is different than the value shifted out of flip-flop chain 39, then the output value provided by toggle flip-flop 33 will change.

More specifically, when contents of successive flip-flops 3–10 are all logic "1" values, the output of 2-input exclusive OR gate 32 will be a logic "0" value. Toggle flip-flop 33 will continue to provide a logic "0" output signal in response to the logic "0" value provided by exclusive OR gate 32.

When a logic "0" value is shifted into flip-flop 2, exclusive OR gate 32 is presented with a logic "0" value from flip-flop 2 and a logic "1" value from flip-flop 10. Under these conditions, exclusive OR gate 32 provides a logic "1" value to toggle flip-flop 33. During the next rising edge of the clock signal, the logic "1" value provided by exclusive OR gate 32 causes toggle flip-flop 33 to toggle from a logic "0" value to a logic "1" value.

After the first logic "0" value is shifted into flip-flop 3, toggle flip-flop 33 will continue to provide a logic "1" output value until: 1) the first logic "0" value is shifted into flip-flop 10, or 2) a second logic "0" value is shifted into flip-flop 3. If the first logic "0" value propagates to the output terminal of flip-flop 10 before a second logic "0" value is provided to flip-flop 3, exclusive OR gate 32 is presented with a logic "0" value from flip-flop 10 and a logic "1" value from flip-flop 2. Under these conditions, exclusive OR gate 32 provides a logic "1" value to toggle flip-flop 33. During the next rising edge of the clock signal, the logic "1" value provided by exclusive OR gate 32 will cause toggle flip-flop 33 to toggle from a logic "1" value to a logic "0" value.

If a second logic "0" value is provided to flip-flop 3 before the initial logic "0" value is provided at the output terminal of flip-flop 10, then exclusive OR gate 32 is presented with a logic "0" value from flip-flop 2 and a logic "1" value from flip-flop 10. Under these conditions, exclusive OR gate 32 provides a logic "1" value to toggle flip-flop 33. During the next rising edge of the clock signal, the logic "1" value provided by exclusive OR gate 32 will cause toggle flip-flop 33 to toggle from a logic "1" value to a logic "0" value.

If a third logic "0" value is provided to flip-flop 3 before the first logic "0" value is provided at the output terminal of flip-flop 10, then exclusive OR gate 32 is presented with a logic "0" value from flip-flop 2 and a logic "1" value from flip-flop 10. Under these conditions, exclusive OR gate 32 provides a logic "1" value to toggle flip-flop 33. During the next rising edge of the clock signal, the logic "1" value provided by exclusive OR gate 32 will cause toggle flip-flop 33 to toggle from a logic "0" value to a logic "1" value.

If the second logic "0" value is provided to flip-flop 3 at the same time that the first logic "0" value is provided at the output terminal of flip-flop 10, then exclusive OR gate 32 is presented with a logic "0" value from both flip-flops 2 and 10. Under these conditions, exclusive OR gate 32 provides a logic "0" value to toggle flip-flop 33. During the next rising edge of the clock signal, the logic "0" value provided by exclusive OR gate 32 will cause toggle flip-flop 33 to continue to provide a logic "1" output value.

The output value provided by toggle flip-flop 33 during a particular clock cycle is therefore a function of the value shifted into flip-flop chain 39 (i.e., the value stored in flip-flop 2), the value being shifted out of flip-flop chain 39 (i.e., the value stored in flip-flop 10), and whether the number of logic "0" values stored in the flip-flop chain 39 is an even number or an odd number. Table 1 provides a summary of the output values provided by toggle flip-flop 33, given the above-described initialization of flip-flop chain 39.

TABLE 1

| FF 2 (CLK = N) | FF 10 (CLK = N) | # OF 0'S IN FF'S 3–10 (CLK = N) | OUTPUT OF XOR GATE 32 (CLK = N) | OUTPUT OF T-FF 33 (CLK = N) | OUTPUT OF T-FF 33 (CLK = N + 1) |
|---|---|---|---|---|---|
| 1 | 1 | EVEN | 0 | 0 | 0 |
| 1 | 1 | ODD  | 0 | 1 | 1 |
| 0 | 1 | EVEN | 1 | 0 | 1 |
| 0 | 1 | ODD  | 1 | 1 | 0 |
| 1 | 0 | EVEN | 1 | 0 | 1 |
| 1 | 0 | ODD  | 1 | 1 | 0 |
| 0 | 0 | EVEN | 0 | 0 | 0 |
| 0 | 0 | ODD  | 0 | 1 | 1 |

After feedback shift register 300 has been initialized as described above, a new value will be shifted into flip-flop 1 during each clock cycle. The values shifted into flip-flop 1 are generated by exclusive OR function 23. As a result, the values shifted into flip-flop 1 will have predetermined values. However, to better describe the operation of feedback shift register 300, a fictional stream of data values to flip-flop 1 will be assumed.

Note that the present invention can also be applied to a shift register that does not include feedback function 23. In such an embodiment, the values shifted into flip-flop 1 can be generated by another function (not shown), which may generate the stream of input values described in the following examples.

Figure 4:
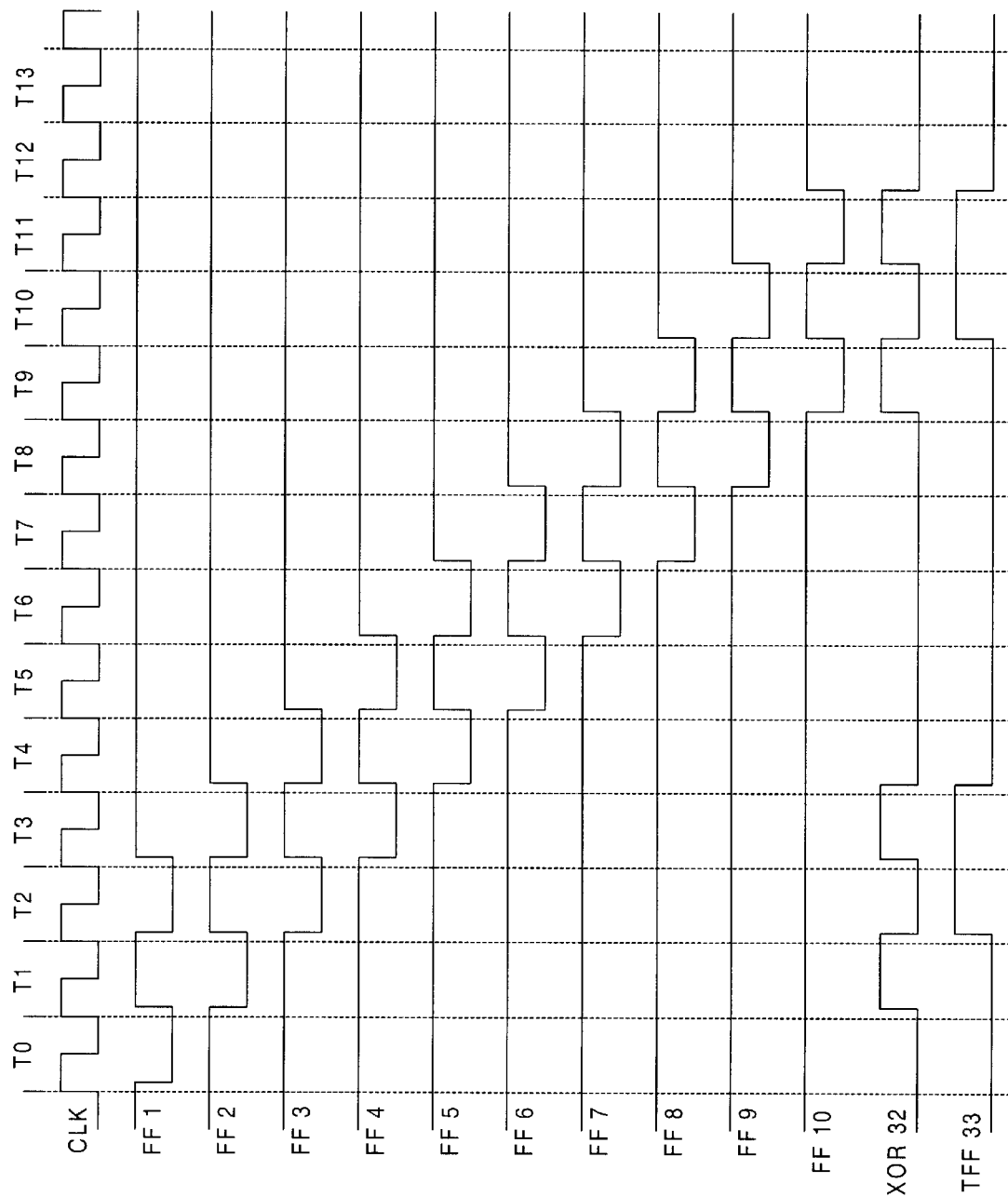
FIG. 4 is a waveform diagram illustrating the operation of a function of the feedback shift register of FIG. 3 in response to one set of input signals.

FIG. 4 is a waveform diagram illustrating the operation of function 31 in response to one set of input signals.

Clock Cycle T0

Referring now to FIG. 4, at the rising edge of clock cycle T0, a logic "0" value is latched into flip-flop 1. During clock cycle T0, all of flip-flops 2–10 store logic "1" values. At this time, the CLEAR control signal is asserted, thereby causing toggle flip-flop 33 to store a logic "0" value. The logic "1" values provided by flip-flops 2 and 10 cause exclusive OR gate 32 to provide a logic "0" value to the T input terminal of flip-flop 33. During clock cycle T0, there are an even number of logic "0" values stored in flip-flops 3–10. This condition is identified in the first row of Table 1.

Clock Cycle T1

At the rising edge of clock cycle T1, the logic "0" value provided by flip-flop 1 is latched into flip-flop 2, and a logic "1" value is latched into flip-flop 1. As a result, flip-flop 2 provides a logic "0" value to an input terminal of exclusive OR gate 32 during clock cycle T1. Because flip-flop 10 provides a logic "1" value to the other input terminal of exclusive OR gate 32 during cycle T1, exclusive OR gate 32 provides a logic "1" value to the T input terminal of flip-flop 33 during cycle T1. During clock cycle T1, there are an even number (0) of logic "0" values stored in flip-flops 3–10. This condition is identified in the third row of Table 1.

Clock Cycle T2

At the rising edge of clock cycle T2, the logic "1" value provided to the T input terminal of flip-flop 33 causes the state of flip-flop 33 to toggle from a logic "0" value to a logic "1" value. The rising edge of clock cycle T2 also causes the logic "0" value provided by flip-flop 2 to be latched into flip-flop 3, the logic "1" value provided by flip-flop 1 to be latched into flip-flop 2, and a logic "0" value to be latched into flip-flop 1. The logic "1" value latched into flip-flop 2 causes the output signal provided by exclusive OR gate 32 to transition to a logic "0" state. During clock cycle T2, there are an odd number (1) of logic "0" values stored in flip-flops 3–10. This condition is indicated in the second row of Table 1.

Clock Cycle T3

At the rising edge of clock cycle T3, the logic "0" value provided to the T input terminal of flip-flop 33 prevents the state of flip-flop 33 from toggling. The rising edge of clock cycle T3 also causes the logic "0" value provided by flip-flop 3 to be latched into flip-flop 4, the logic "1" value provided by flip-flop 2 to be latched into flip-flop 3, the logic "0" value provided by flip-flop 2 to be latched into flip-flop 1, and a logic "1" value to be latched into flip-flop 1. The logic "0" value latched into flip flop 2, combined with the logic "1" value provided by flip-flop 10, cause exclusive OR gate 32 to provide a logic "1" value to T flip-flop 33. During clock cycle T3, there are an odd number (1) of logic "0" values stored in flip-flops 3–10. This condition is indicated in the fourth row of Table 1.

Clock Cycle T4

At the rising edge of clock cycle T4, the logic "1" value provided to the T input terminal of flip-flop 33 causes the state of flip-flop 33 to toggle from a logic "1" value to a logic "0" value. The rising edge of clock cycle T4 also causes the logic "0" value provided by flip-flop 4 to be latched into flip-flop 5, the logic "1" value provided by flip-flop 3 to be latched into flip-flop 4, the logic "0" value provided by flip-flop 2 to be latched into flip-flop 3, the logic "1" value from flip-flop 1 to be latched into flip-flop 2, and a logic "1" value to be latched into flip-flop 1. The logic "1" value latched into flip flop 2, combined with the logic "1" value provided by flip-flop 10, causes exclusive OR gate 32 to provide a logic "0" value to T flip-flop 33. During clock cycle T4, there are an even number (2) of logic "0" values stored in flip-flops 3–10. This condition is indicated in the first row of Table 1.

Clock Cycles T5–T8

During clock cycles T5–T8, no new logic "0" values are provided to flip-flop 1. As a result, the two above-described logic "0" values propagate through flip-flops 3–9 during clock cycles T5–T8. During clock cycles T5–T8, exclusive OR gate 32 provides a logic "0" output value and the state of T flip flop 33 remains at a logic "0" value.

Clock Cycle T9

At the rising edge of clock cycle T9, the initial logic "0" value is latched into flip-flop 10. This logic "0" value is provided to an input terminal of exclusive OR gate 32. Because flip-flop 2 stores a logic "1" value at this time, exclusive OR gate 32 provides a logic "1" value to toggle flip-flop 33. During clock cycle T9, there are an even number (2) of logic "0" values stored in flip-flops 3–10. This condition is indicated in the fifth row of Table 1.

Clock Cycle T10

At the rising edge of clock cycle T10, the logic "1" value provided to the T input terminal of flip-flop 33 causes the state of flip-flop 33 to toggle from a logic "0" value to a logic "1" value. The rising edge of clock cycle T10 also causes the logic "1" value provided by flip-flop 7 to be latched into flip-flop 8, the logic "0" value provided by flip-flop 8 to be latched into flip-flop 9, and the logic "1" value provided by flip flop 9 to be latched into flip flop 10. The logic "1" value latched into flip flop 10, combined with the logic "1" value provided by flip-flop 2, cause exclusive OR gate 32 to provide a logic "0" value to T flip-flop 33. During clock cycle T10, there are an odd number (1) of logic "0" values stored in flip-flops 3–10. This condition is indicated in the second row of Table 1.

Clock Cycle T11

At the rising edge of clock cycle T11, the logic "0" value provided to the T input terminal of flip-flop 33 prevents the state of flip-flop 33 from toggling. The rising edge of clock cycle T11 also causes the logic "1" value provided by flip-flop 8 to be latched into flip-flop 9, and the logic "0" value provided by flip-flop 9 to be latched into flip-flop 10. The logic "0" value latched into flip flop 10, combined with the logic "1" value provided by flip-flop 2, cause exclusive OR gate 32 to provide a logic "1" value to T flip-flop 33. During clock cycle T11, there are an odd number (1) of logic "0" values stored in flip-flops 3–10. This condition is indicated in the sixth row of Table 1.

Clock Cycle T12

At the rising edge of clock cycle T12, the logic "1" value provided to the T input terminal of flip-flop 33 causes the state of flip-flop 33 to toggle from a logic "1" value to a logic "0" value. The rising edge of clock cycle T12 also causes the logic "1" value provided by flip-flop 9 to be latched into flip-flop 10. The logic "1" value latched into flip flop 10, combined with the logic "1" value provided by flip-flop 2, cause exclusive OR gate 32 to provide a logic "0" value to T flip-flop 33. During clock cycle T12, there are an even number (0) of logic "0" values stored in flip-flops 3–10. This condition is indicated in the first row of Table 1.

Two conditions of Table 1 (i.e., rows 7 and 8) are not defined by the waveform diagram of FIG. 4. However, these two conditions are defined in the waveform diagram of FIG. 5.

Figure 5:
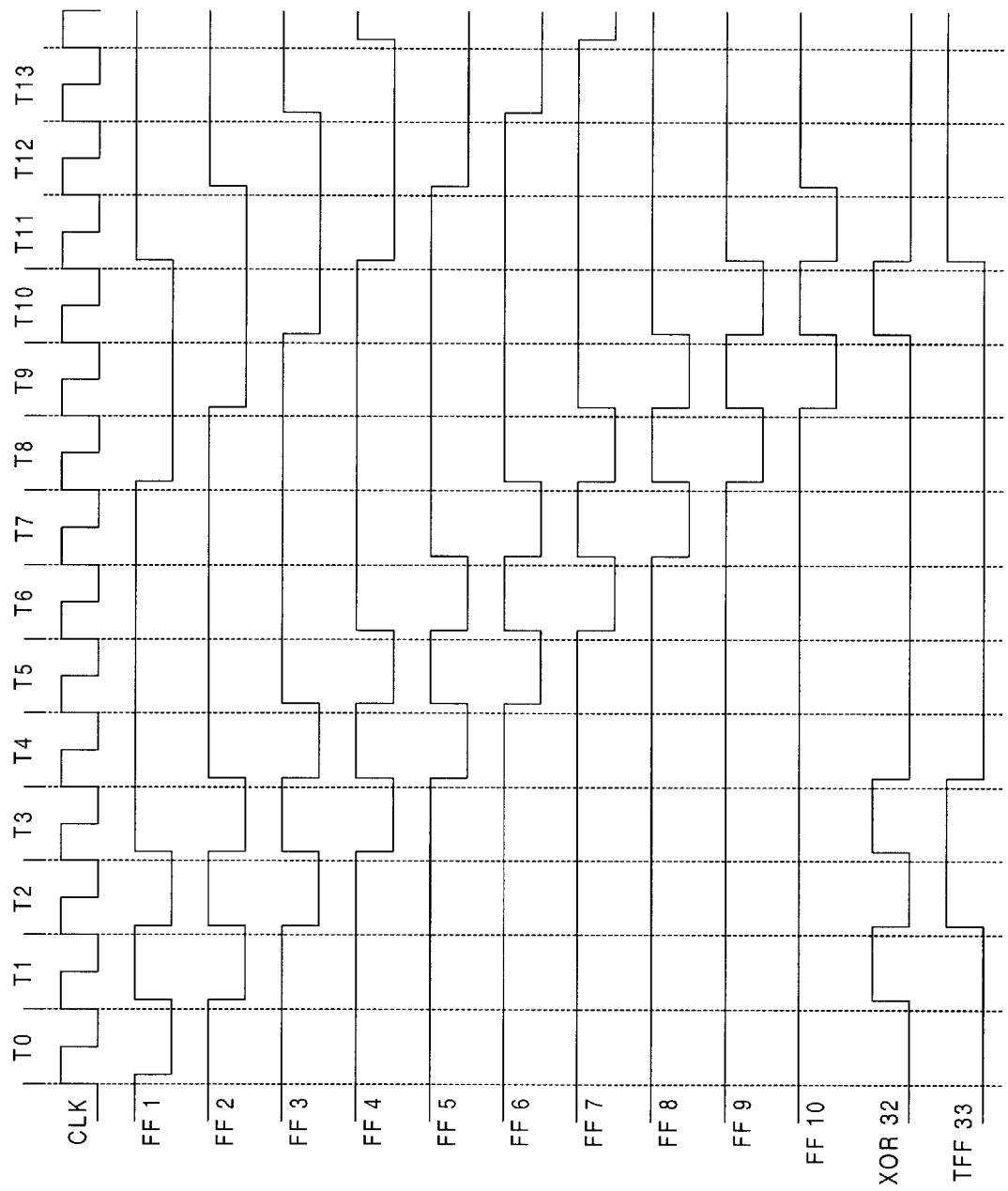
FIG. 5 is a waveform diagram illustrating the operation of a function of the feedback shift register of FIG. 3 in response to another set of input signals.

FIG. 5 is a waveform diagram that is identical to the waveform diagram of FIG. 4 between clock cycles T0–T7. However, at the rising edge of clock cycle T8 of FIG. 5, a logic "0" value is latched into flip-flop 1.

At the rising edge of clock cycle T9, the logic "0" value provided by flip-flop 1 is latched into flip-flop 2, and another logic "0" value is latched into flip-flop 1. During clock cycle T9, both flip-flop 2 and flip-flop 10 provide logic "0" values to exclusive OR gate 32. As a result, exclusive OR gate 32 provides a logic "0" value to T flip-flop 33. During clock cycle T9, there are an even number (2) of logic "0" values stored in flip-flops 3–10. This condition is indicated in the seventh row of Table 1.

At the rising edge of clock cycle T10, the logic "0" value provided by flip-flop 1 is latched into flip-flop 2, the logic "0" value provided by flip-flop 2 is latched into flip-flop 3, and another logic "0" value is loaded into flip-flop 1. During clock cycle T10, flip-flop 2 provides a logic "0" value to exclusive OR gate 32 and flip-flop 10 provides a logic "1" value to exclusive OR gate 32. As a result, exclusive OR gate 32 provides a logic "1" value to T flip-flop 33. During clock cycle T10, there are an even number (2) of logic "0" values stored in flip-flops 3–10. This condition is indicated in the third row of Table 1.

At the rising edge of clock cycle T11, the logic "1" value provided to the T input terminal of flip-flop 33 causes the state of flip-flop 33 to toggle from a logic "0" value to a logic "1" value. Also at the rising edge of clock cycle T11, the logic "0" value provided by flip-flop 3 is latched into flip-flop 4, the logic "0" value provided by flip-flop 2 is latched into flip-flop 3, and the logic "0" value provided by flip-flop 1 is latched into flip-flop 2. During clock cycle T11, both flip-flop 2 and flip-flop 10 provide logic "0" values to exclusive OR gate 32. As a result, exclusive OR gate 32 provides a logic "0" value to T flip-flop 33. During clock cycle T11, there are an odd number (3) of logic "0" values stored in flip-flops 3–10. This condition is indicated in the eighth row of Table 1.

Note that the output signal provided by toggle flip-flop 33 of function 31 is logically equivalent to the output signal provided by exclusive OR function 21.

The relative costs to implement an N-input exclusive OR function constructed using a tree structure of (N–1) 2-input exclusive OR gates (FIGS. 1 and 2) and the structure of function 31 will now be examined. In this comparison, the number of transistors required to construct a 2-input exclusive OR gate is designated as $N_{XOR}$, and the number of transistors required to construct toggle flip-flop 33 is designated as $N_{TFF}$. The number of transistors required to implement an N-input exclusive OR device using a tree structure is therefore equal to $(N-1) \times N_{XOR}$. The number of transistors required to implement exclusive OR function 31 is equal to $N_{XOR}+N_{TFF}$. Combining these equations, it is determined that exclusive OR function 31 requires fewer transistors than an exclusive OR function using a tree structure (e.g., exclusive OR function 21) whenever $N_{TFF}$ is less than $N_{XOR} \times (N-2)$.

The relative signal delays of an N-input exclusive OR function constructed using a tree structure of (N–1) 2-input exclusive OR gates (FIGS. 1 and 2) and the structure of function 31 will now be examined. In this comparison, the propagation delay of an exclusive OR gate is designated as $T_{XOR}$, the clock-to-out delay of a DQ or toggle flip-flop is designated as $T_{CLK-TO-OUT}$, the set-up time for a toggle flip-flop is designated as $T_{TFF-SETUP}$, and the set-up time for a DQ flip-flop is designated as $T_{DFF-SETUP}$. Note that $T_{TFF-SETUP}$ is typically longer than $T_{DFF-SETUP}$.

The total signal delay for functions 21 and 22 of FIG. 1, is equal to $T_{CLK-TO-OUT}+T_{XOR} \times (\mathrm{ceiling}(\log_2(N+2))+T_{DFF-SETUP}$, where 'ceiling' indicates an upward truncation. Note that (N+2) is used because N-input exclusive OR function 21 provides an input signal to 3-input exclusive OR function 22, which is equivalent to an (N+2), or 10, input exclusive OR device.

The total signal delay for exclusive OR functions 31 and 22 of FIG. 3 is determined by the longer signal delay existing along two parallel paths. A signal that propagates through the first signal path during a first clock cycle will subsequently propagate through the second signal path curing a subsequent second clock cycle. The first signal path exists from the output of flip-flops 2 and 10, through exclusive OR gate 32 and into toggle flip-flop 33. The delay of this signal path is equal to $T_{CLK-TO-OUT}+T_{XOR}+T_{TFF-SETUP}$.

The second signal path exists from the output of flip-flops 12, 13 and 33, through exclusive OR gate 22 and into DQ flip-flop 19. The delay of this signal path is equal to $T_{CLK-TO-OUT}+T_{XOR} \times (\mathrm{ceiling}(\log_2(3))+T_{DFF-SETUP}$. Note that for all positive values of N, the delay of the second signal path is less than or equal to the total signal delay of functions 21 and 22 (FIG. 1). Thus, the second signal path will never have a longer signal delay than the total signal path of exclusive OR functions 21 and 22.

In addition, the signal delay of the first path of functions 31 and 22 (FIG. 3) is less than the total signal delay for functions 21 and 22 (FIG. 1) as long as, $$T_{CLK-TO-OUT}+T_{XOR\ X}(\mathrm{ceiling}(\log_2 N+2))+T_{DFF-SETUP} > T_{CLK-TO-OUT}+T_{XOR}+T_{TFF-SETUP}$$

or, $$T_{XOR\ X}(\mathrm{ceiling}(\log_2 N+2))+T_{DFF-SETUP} > T_{XOR}+T_{TFF-SETUP}.$$

Assuming that $T_{TFF-SETUP}=T_{DFF-SETUP}+T_{XOR}$ (i.e., that a T flip-flop is a DQ flip-flop with an exclusive OR gate coupled to the D input terminal), then the above equation reduces to:

$$\mathrm{ceiling}(\log_2 N+2) > 2$$

or, $$N+2 > 4$$

or, $N>2$.

Thus, the total signal delay for exclusive OR function 31 is less than the total signal delay for an N-input exclusive OR function constructed using a tree structure of (N−1) 2-input exclusive OR gates for values of N greater than 2.

Expansion to Functions Other than Exclusive OR

The present invention can also be expanded to implement functions of consecutive shift-register bits other than an exclusive OR function.

FIG. 6 is a circuit diagram of a feedback shift register 600 that includes 8-input OR function 61, 3-input exclusive OR function 62 and four input exclusive OR function 63. 8-input OR function 61 is coupled to receive the Q output signals of flip-flops 3–10. However, as illustrated in FIG. 7, 8-input OR function 61 can be replaced by an OR function 71 that is constructed with a 2-input exclusive OR gate 72 and a 3-bit up/down counter 73. The up/down counter is selected to be a $\log_2(N)$ bit counter. Counter 73 includes a count input (C) and an up/down input (U/D).

When flip-flops 3–10 all store logic "0" values, counter 73 is reset to a count of "000". When exclusive OR gate 72 provides a logic "0" value, counter 73 will not be incremented or decremented. When exclusive OR gate 72 provides a logic "1" value, then the value of the bit to be shifted in is different than the value of the bit to be shifted out. Under this condition, counter 73 is incremented if a logic "1" value is being shifted in and a logic "0" value is being shifted out. Conversely, counter 73 is decremented if a logic "0" value is being shifted in and a logic "1" is being shifted out. Thus, incrementing is performed when exclusive OR gate 72 provides a logic "1" value to the count input terminal of counter 73 and flip-flop 2 provides a logic "1" value to the up/down input terminal of counter 73. Similarly, decrementing is performed when exclusive OR gate 72 provides a logic "1" value to the count input terminal of counter 73 and flip-flop 2 provides a logic "0" value to the up/down input terminal of counter 73. Counter 73 will never be incremented beyond a count of N because there cannot be more than N logic "1" bits stored in the N flip-flops. Similarly, counter 73 will never be decremented below a count of 0 because there can never be fewer than 0 flip-flops storing logic "1" bits. Up/down counter 73 provides a logic "0" output signal if and only if all 3-bits of up/down counter 73 have a logic "0" value. Otherwise, up/down counter 73 provides a logic "1" output signal.

A NOR function can be implemented in a manner similar to OR function 71. To implement a NOR function, up/down counter 73 is modified to provide a logic "1" output signal if and only if all 3-bits of up/down counter 73 have a logic "0" value. Otherwise, up/down counter 73 should provide a logic "0" output signal.

An AND function can also be implemented in a manner similar to OR function 71. To implement a AND function, up/down counter 73 is modified to provided a logic "1" output signal if and only if all 3 bits of up/down counter 73 have a logic "1" value. Otherwise, up/down counter 73 should provide a logic "0" output signal.

In addition, a NAND function can be implemented in a manner similar to OR function 71. To implement a NAND function, up/down counter 73 is modified to provided a logic "0" output signal if and only if all 3 bits of up/down counter 73 have a logic "1" value. Otherwise, up/down counter 73 should provide a logic "1" output signal.

It is noted that the implementation of functions other than an exclusive OR function will be less efficient in terms of transistor count reduction and reduction of signal delay.

FIFO Implementation

Long shift registers are often implemented with a random access memory (RAM) and control logic to provide a read pointer and a write pointer. The read pointer points to the next location in the RAM to be read, and the write pointer points to the next location in the RAM to be written. At a predetermined (e.g., rising) edge of a clock signal, a new bit is written to the address pointed at by the write pointer, and a bit is read from the address pointed at by the read pointer. Both pointers are then incremented. After a pointer reaches the last address of the RAM, the pointer wraps around to the first address of the RAM. A RAM configured in this manner is referred to as a first-in-first-out (FIFO) memory. When the FIFO memory has a constant length (i.e., there is a constant difference between the write pointer and the read pointer) and for every bit written a bit is read, the FIFO is equivalent to a shift register.

However, in order to read the values of interim shift register bits stored in a FIFO, a read operation from the RAM must be done, preceded by address calculation. Thus, this implementation is not very efficient for circuits such as the feedback shift register 100 of FIG. 1, where a multitude of interim points are needed. However, for long shift registers (i.e., having hundreds of bits or more), where speed is not critical, a FIFO is typically used to implement the shift register.

When an exclusive OR function of internal shift register bits is to be generated, a sequence of read operations must be performed. The exclusive OR function is performed one bit at a time using a dedicated register. For example, exclusive OR function 21 (FIG. 1) is performed as follows using a FIFO memory. First, an address register is set to a value equal to the write pointer minus three, such that the address register stores an address corresponding with the value written to the FIFO three cycles ago. This address corresponds with the address of flip-flop 3 in shift register 100. If the value of the write pointer minus three is negative, then the memory size (e.g., 18) is added to the value, thereby performing a wrap-around calculation (because the FIFO is a circular buffer). Next, an exclusive OR register is reset to store a logic "0" value. The following sequence must then be repeated eight times.

A logical exclusive OR is taken of the contents of the exclusive OR register and the contents of the memory location pointed to by the address register. The result is then stored in the exclusive OR register. The address register is then decremented. If the address register is decremented to a zero address, then the memory size is stored in the address register, thereby performing a wrap-around calculation.

The problem with this FIFO implementation of a shift register is that in order to extract bits from the shift register, accesses to the RAM must be performed, with address calculation and wrap-around. For each clock tick in this shift register, eight accesses need to be performed just to calculate exclusive OR function 21.

In contrast, it is much easier to implement shift register 300 (FIG. 3) using a FIFO memory. Thus, exclusive OR function 31 (FIG. 3) is performed as follows using a FIFO memory. First, when the contents of the FIFO corresponding with flip-flops 3–10 all store logic "1" values, then an exclusive OR register is reset to a logic "0" value. For each clock tick, an address register set to a value equal to the write pointer minus two, such that the address register stores an address corresponding with the value written to the FIFO two cycles ago. This address corresponds with the address of flip-flop 2 in shift register 300. If the value of the write pointer minus two is negative, then the memory size (e.g., 18) is added to the value, thereby performing a wrap-around calculation (because the FIFO is a circular buffer). Next, the FIFO is read from the location identified by the value stored in the address register, and the result is stored in the exclusive OR register.

Eight is then subtracted from the contents of the address register, such that the address register stores an address corresponding with the value written to the FIFO ten cycles ago. This address corresponds with the address of flip-flop 10 in shift register 300. If the value stored in the address register minus eight is negative, then the memory size (e.g., 18) is added to the value, thereby performing a wrap-around calculation (because the FIFO is a circular buffer). Next, the FIFO is read from the location identified by the value stored in the address register, and the result is exclusive OR'ed with the contents of the exclusive OR register.

This FIFO implementation of a shift register advantageously only requires two memory accesses for every clock tick to evaluate function 31, thereby providing for significantly faster operation than the conventional method, which requires eight memory accesses.

Expansion of the Patent to Software Implementations

The present invention (including the shift register embodiments and the FIFO embodiments) can be implemented in software as well as hardware. In addition, a parity check can be implemented using software to compare an incoming bit with an outgoing bit, rather than checking all the relevant bits of a word for parity.

Figure 8:
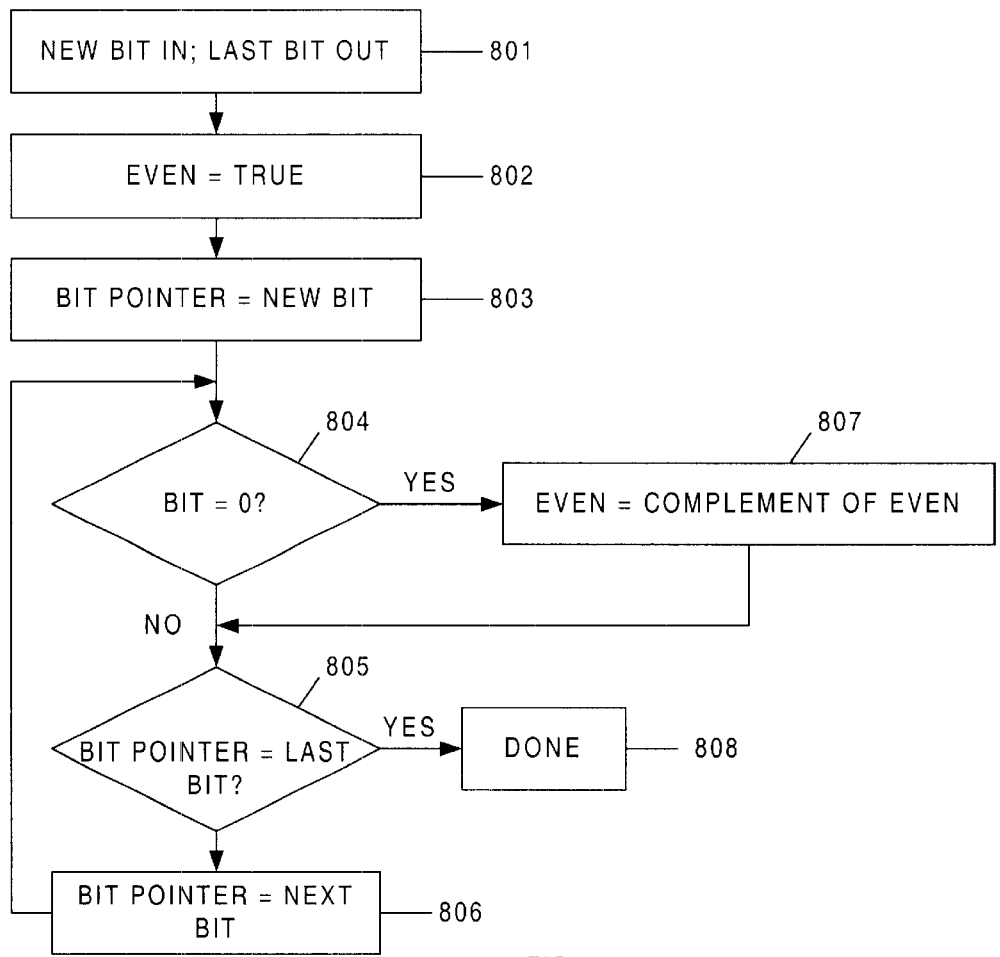
FIG. 8 is a flow diagram of a conventional software implementation of a shift register.

FIG. 8 is a flow diagram of a conventional software implementation of a shift register. In this example, all bits of the shift register are used in the function. In Step 801, a new bit is shifted into the shift register and a last bit is shifted out of the shift register. In Step 802, the parameter EVEN is set to a TRUE value. In Step 803, a bit pointer is set to point at the first bit of the shift register (i.e., at the new bit). In Step 804, it is determined whether the bit pointed at by the bit pointer has a logic "0" value. If so, then the parameter EVEN is set equal to its complement in Step 807. If not, then it is determined whether the bit pointed at by the bit pointer is the last bit in the shift register in Step 805. If so, then the procedure is complete (Step 808). If not, then the bit pointer is incremented (Step 806), and processing returns to Step 804.

Figure 9:
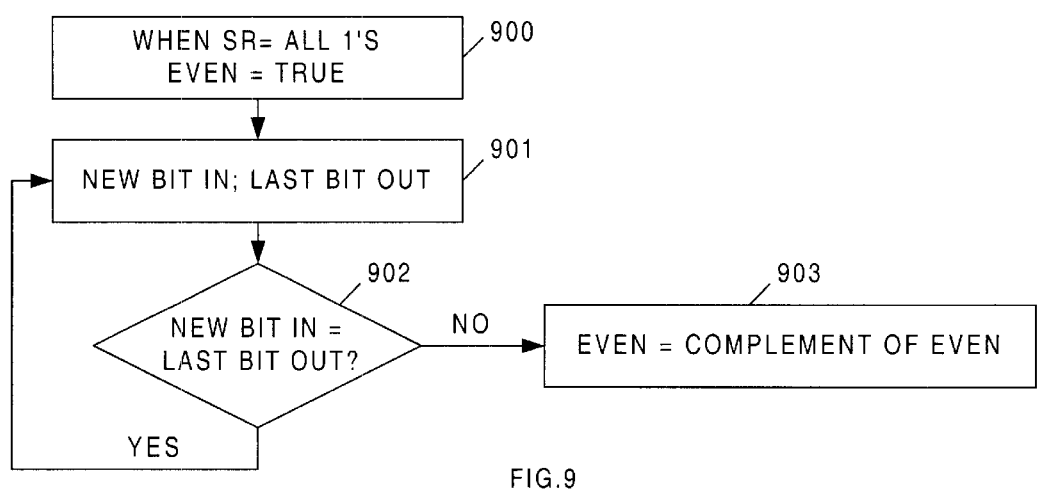
FIG. 9 is a flow diagram of a software implementation of a shift register in accordance with one embodiment of the present invention.

FIG. 9 is a flow diagram of a software implementation of a shift register in accordance with one embodiment of the present invention. In this example, all bits of the shift register are used in the function. In Step 900 the parameter EVEN is set to a TRUE value when the shift register is known to store all logic "1" values. In Step 901, a new bit is shifted into the shift register and a last bit is shifted out of the shift register. In Step 902, it is determined whether the new bit shifted into the shift register is equal to the last bit shifted out of the shift register. If not, then the parameter EVEN is set equal to its complement in Step 903. If so, then processing returns to Step 901.

Although the invention has been described in connection with several embodiments, it is understood that this invention is not limited to the embodiments disclosed, but is capable of various modifications which would be apparent to a person skilled in the art. Thus, the invention is limited only by the following claims.

What is claimed is:

1. A circuit for providing a function of a plurality of consecutive bits in a shift register, the circuit comprising:

a 2-input logic gate having a first input terminal connected to receive a bit being shifted into the shift register, and a second input terminal coupled to receive a bit being shifted out of the shift register; and a sequential logic device having an input terminal coupled to an output terminal of the 2-input logic gate, an output terminal that provides the function, and a control terminal coupled to receive a control signal for resetting the sequential logic device, wherein the sequential logic device is not in the path of the shift register.

2. The circuit of claim 1, wherein the 2-input logic gate is an exclusive OR logic gate.

3. The circuit of claim 2, wherein the sequential logic device is a toggle flip-flop.

4. The circuit of claim 3, wherein the function is a logical exclusive OR of the consecutive bits in the shift register.

5. The circuit of claim 2, wherein the sequential logic device is an up/down counter.

6. The circuit of claim 1, wherein the function is a logical OR of the consecutive bits in the shift register.

7. The circuit of claim 1, wherein the function is a logical NOR of the consecutive bits in the shift register.

8. The circuit of claim 1, wherein the function is a logical AND of the consecutive bits in the shift register.

9. The circuit of claim 1, wherein the function is a logical NAND of the consecutive bits in the shift register.

10. The circuit of claim 1, wherein the number of consecutive bits is greater than two.

11. The circuit of claim 1, wherein the shift register is a feedback shift register.

12. A method of providing a function of a plurality of consecutive bits of a shift register, the method comprising the steps of:

initializing an output signal of a sequential logic device when the consecutive bits of the shift register have a predetermined value; and then determining whether a bit to be shifted into the shift register matches a bit to be shifted out of the shift register;

toggling the output signal of the sequential logic device if the bit to be shifted into the shift register does not match the bit to be shifted out of the shift register; and maintaining the output signal of the sequential logic device if the bit to be shifted into the shift register matches the bit to be shifted out of the shift register.

13. The method of claim 12, wherein the function is a logical exclusive OR of the consecutive bits in the shift register.

14. The method of claim 12, wherein the step of determining is performed with a 2-input exclusive OR gate.

15. The method of claim 12, wherein the predetermined value comprises logic "0" values for each of the consecutive bits of the shift register.

16. The method of claim 12, wherein the number of consecutive bits of the shift register is greater than two.

17. The method of claim 12, wherein the sequential logic device is a toggle flip-flop.

18. A method of providing a function of a plurality of consecutive bits of a shift register, the method comprising the steps of:

initializing an output signal of a sequential logic device when the consecutive bits of the shift register have a predetermined value; and then determining whether a bit to be shifted into the shift register matches a bit to be shifted out of the shift register;

incrementing the output signal of the sequential logic device if the bit to be shifted into the shift register does not match the bit to be shifted out of the shift register; and decrementing the output signal of the sequential logic device if the bit to be shifted into the shift register matches the bit to be shifted out of the shift register.

19. The method of claim 18, wherein the function is a logical OR of the consecutive bits in the shift register.

20. The method of claim 18, wherein the function is a logical NOR of the consecutive bits in the shift register.

21. The method of claim 18, wherein the function is a logical AND of the consecutive bits in the shift register.

22. The method of claim 18, wherein the function is a logical NAND of the consecutive bits in the shift register.

23. The method of claim 18, wherein the number of consecutive bits is greater than two.

24. A circuit for providing a function of a plurality of consecutive bits in a first in, first out (FIFO) memory, the circuit comprising:

means for storing a predetermined value in a first register when the consecutive bits all have a predetermined logic state;

means for reading a first one of the consecutive bits in the FIFO memory in response to a first pointer of the FIFO memory and loading the first one of the consecutive bits into the first register;

means for reading a second one of the consecutive bits in response to a second pointer of the FIFO memory; and an exclusive OR gate coupled to receive the first one of the consecutive bits stored in the first register and the second one of the consecutive bits.

25. The circuit of claim 24, wherein the first pointer is a write pointer and the second pointer is a read pointer.

26. The circuit of claim 24, wherein the first one of the consecutive bits is read from a location with a fixed relationship with respect to the first pointer.

27. The circuit of claim 26, wherein the second one of the consecutive bits is read from a location with a fixed relationship with respect to the second pointer.

28. The circuit of claim 24, wherein the first one of the consecutive bits is an initial bit in the set of consecutive bits, and the second one of the consecutive bits is a last bit in the set of consecutive bits.

29. A method for providing a function of a plurality of consecutive bits in a first in, first out (FIFO) memory, the method comprising the steps of:

storing a predetermined value in a first register when the consecutive bits all have a predetermined logic state;

reading a first one of the consecutive bits in the FIFO memory in response to a first pointer of the FIFO memory;

loading the first one of the consecutive bits into the first register;

reading a second one of the consecutive bits in response to a second pointer of the FIFO memory; and performing an exclusive OR function in response to the first one of the consecutive bits stored in the first register and the second one of the consecutive bits.

30. The method of claim 29, wherein the first pointer is a write pointer and the second pointer is a read pointer.

31. The method of claim 29, wherein the first one of the consecutive bits is read from a location with a fixed relationship with respect to the first pointer.

32. The method of claim 31, wherein the second one of the consecutive bits is read from a location with a fixed relationship with respect to the second pointer.

33. The circuit of claim 29, wherein the first one of the consecutive bits is an initial bit in the set of consecutive bits, and the second one of the consecutive bits is a last bit in the set of consecutive bits.

34. A method for providing a function of a set of consecutive bits in a shift register, the method comprising the steps of:

setting a state of a parameter to a predetermined logic state when the consecutive bits all have a predetermined logic value; then shifting a bit into the set of consecutive bits of the shift register and shifting a bit out of the set of consecutive bits of the shift register;

determining whether the bit shifted into the shift register has the same logic value as the bit shifted out of the shift register; and toggling the logic state of the parameter if the bit shifted into the shift register does not have the same logic value as the bit shifted out of the shift register.

35. A circuit for providing a function of a plurality of consecutive bits in a shift register, the circuit comprising:

a 2-input exclusive OR gate having a first input terminal connected to receive a bit being shifted into the shift register, and a second input terminal coupled to receive a bit being shifted out of the shift register; and a toggle flip-flop having an input terminal coupled to an output terminal of the 2-input exclusive OR gate, an output terminal that provides the function, which is a logical exclusive OR of the consecutive bits in the shift register, and a control terminal coupled to receive a control signal for resetting the toggle flip-flop.

36. A circuit for providing a function of a plurality of consecutive bits in a shift register, the circuit comprising:

a 2-input exclusive OR gate having a first input terminal connected to receive a bit being shifted into the shift register, and a second input terminal coupled to receive a bit being shifted out of the shift register; and an up/down counter having an input terminal coupled to an output terminal of the 2-input exclusive OR gate, an output terminal that provides the function, and a control terminal coupled to receive a control signal for resetting the up/down counter.

\* \* \* \* \*

UNITED STATES PATENT AND TRADEMARK OFFICE
CERTIFICATE OF CORRECTION

PATENT NO. : 6,396,896 B1
DATED : May 28, 2002
INVENTOR(S) : Yoav Lavi

It is certified that error appears in the above-identified patent and that said Letters Patent is hereby corrected as shown below:

Column 8,
Lines 36-37, the word "curing" is corrected to -- during --.

Signed and Sealed this

Thirtieth Day of July, 2002

Attest:

Attesting Officer

JAMES E. ROGAN
Director of the United States Patent and Trademark Office